May 13, 1969 E. PAULUS 3,444,550

LOGARITHMIC ANALOG TO DIGITAL CONVERTER

Filed April 1, 1965 Sheet 1 of 8

| Output Voltage $u_a$ | $a_1$ ($2^2$) | $a_2$ ($2^1$) | $a_3$ ($2^0$) |
|---|---|---|---|
| $u_e \cdot 10^{8g_0/20} > R > u_e \cdot 10^{7g_0/20}$ | 0 | 0 | 0 |
| $u_e \cdot 10^{7g_0/20} > R > u_e \cdot 10^{6g_0/20}$ | 0 | 0 | 1 |
| $u_e \cdot 10^{6g_0/20} > R > u_e \cdot 10^{5g_0/20}$ | 0 | 1 | 0 |
| $u_e \cdot 10^{5g_0/20} > R > u_e \cdot 10^{4g_0/20}$ | 0 | 1 | 1 |
| $u_e \cdot 10^{4g_0/20} > R > u_e \cdot 10^{3g_0/20}$ | 1 | 0 | 0 |
| $u_e \cdot 10^{3g_0/20} > R > u_e \cdot 10^{2g_0/20}$ | 1 | 0 | 1 |
| $u_e \cdot 10^{2g_0/20} > R > u_e \cdot 10^{g_0/20}$ | 1 | 1 | 0 |
| $u_e \cdot 10^{g_0/20} > R$ | 1 | 1 | 1 |

(Binary Value: $a_1$, $a_2$, $a_3$)

May 13, 1969 E. PAULUS 3,444,550

LOGARITHMIC ANALOG TO DIGITAL CONVERTER

Filed April 1, 1965 Sheet 3 of 8

| Digital Value $a_1$ $(2^2)$ | $a_2$ $(2^1)$ | $a_3$ $(2^0)$ | Analog Value $i_a$ |
|---|---|---|---|
| 0 | 0 | 0 | $I_o \cdot 10^{-7b_o/20}$ |
| 0 | 0 | 1 | $I_o \cdot 10^{-6b_o/20}$ |
| 0 | 1 | 0 | $I_o \cdot 10^{-5b_o/20}$ |
| 0 | 1 | 1 | $I_o \cdot 10^{-4b_o/20}$ |
| 1 | 0 | 0 | $I_o \cdot 10^{-3b_o/20}$ |
| 1 | 0 | 1 | $I_o \cdot 10^{-2b_o/20}$ |
| 1 | 1 | 0 | $I_o \cdot 10^{-b_o/20}$ |
| 1 | 1 | 1 | $I_o$ |

United States Patent Office
3,444,550
Patented May 13, 1969

3,444,550
LOGARITHMIC ANALOG TO DIGITAL CONVERTER

Erwin Paulus, Vienna, Austria, assignor to International Business Machines Corporation, Armonk, N.Y., a corporation of New York Filed Apr. 1, 1965, Ser. No. 444,631
Claims priority, application Austria, Jan. 20, 1965, A 459/65
Int. Cl. H03k 13/02
U.S. Cl. 340—347 2 Claims

ABSTRACT OF THE DISCLOSURE

This invention relates to an analog-to-digital converter for directly converting the logarithm of electric analog values into binary numbers. A plurality of series connected amplifier circuits with sensing networks between each stage are employed to convert the analog signal to a binary output. The gains of each of the amplifier circuits are different from each other with the highest gain amplifier at the input and each successive amplifier stage having one-half the preceding amplifier's gain. The sensing circuit at the output of each amplifier determines whether the input to the amplifier is directed to the input of the next stage or whether the output of that amplifier is directed to the input of the next stage.

Figure 1:
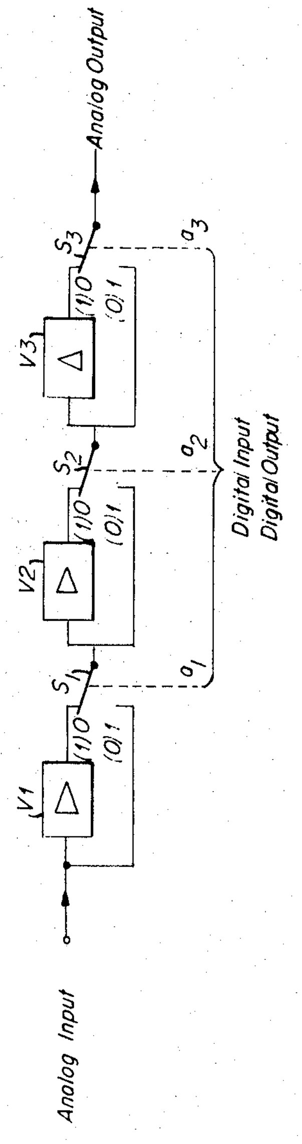

This invention relates to an analog-to-digital or digital-to-analog converter for directly converting the logarithm of electric analog values into binary numbers represented in parallel or for converting the antilogarithm of binary numbers represented in parallel into electric analog values.

Arrangements of this type are required in the telecommunication art, in particular in the control and regulation art and in the fields of remote metering and remote control. Also, a major field of application exists wherever analog and digital computers are used simultaneously and where it is thus constantly necessary to change from digital to analog values and vice versa.

In the known analog-to-digital converters, the electric analog values are not converted directly into digital values but an indirect approach using suitable intermediate values is preferred.

Thus, e.g., a voltage to be converted is compared to a sawtooth voltage rising linearly with time. The time from the beginning of the rise of the sawtooth voltage to the arrival at the level of the voltage to be measured is proportional to this voltage. This time is then measured and represented in a digital form.

In other converters, the number of units contained in the voltage to be measured is determined by producing the same value by means of digital-to-analog converters, or by subtracting units from the value to be converted until the difference has become smaller than such a unit.

If it is desired to convert not electric voltages but electric currents, such currents are first converted into proportional voltages through the voltage drop at resistors.

In the known digital-to-analog converters for converting numerals into electric parameters, resistors or current or voltage sources are composed by means of switches from which the analog value is then derived.

The simplest types of such converters are incrementally switchable voltage dividers. In other known converters, the individual digits have assigned thereto partial currents or voltages, the latter being superimposed under consideration of the order values of the respective digits.

The technically simpler ones of the aforementioned known analog-to-digital or digital-to-analog converters partly have a too low resolution for the present requirements and for the other part are too inaccurate or too slow. Also the technically more complex converters do not yet present the required properties. Where the desired properties are attained, however, the required complexity of structure is unreasonably great.

This invention has for its object to enable, at reasonable expense, the construction of accurate, high speed analog-to-digital or digital-to-analog converters having a resolution which, as compared to known converters, is high and obtainable by relatively simple means. For the converters which serve for the direct conversion of electric analog values into binary numbers represented in parallel and vice versa, the solution resides in the provision that a number of linear D.C. voltage or direct current amplifiers corresponding to the number of binary orders ($n$), which have defined gains graded binarily from $2^{n-1}\cdot g_0$ to $2^0\cdot g_0$ in the logarithmic dimension, are connected in series, the individual amplifiers, in accordance with the magnitude of the value to be converted, adding or not adding to the over-all amplification of the series connection.

An advantageous analog-to-digital converter is obtained by the provision that the analog value is applied to the input of the amplifier having the greatest gain, that the amplifier output voltages control a respectively following threshold switch, the threshold value of which corresponds to one binary unit, in such a manner that the input of a respectively following amplifier is connected to the output of the preceding amplifier whenever the latter's output voltage is lower than said threshold value (binary "0") and that it is, on the other hand, connected to the input of the respectively preceding amplifier whenever the latter's output voltage is equal to or higher than said threshold value (binary "1"). The resolution may be established in a simple manner by the selection of the gains or the magnitude of the threshold value, respectively, which are fixed according to the invention, and it is limited practically only by the technically realizable gains. Even very small analog values are capable of being converted directly. The conversion speed is limited merely by the inertia of the circuit elements employed.

It is of advantage to design an analog-to-digital converter in accordance with this invention so that the input of an amplifier is respectively connected to one input of a gate circuit, that the amplifier output is applied to a Schmitt trigger determining the threshold value and to a modulator controlled thereby and applying the output voltage of said amplifier to the other input of said gate circuit only with the Schmitt trigger in its OFF position, and that said gate circuit respectively applies the input which is greater in magnitude to the input of the next following amplifier.

In accordance with this invention, a digital-to-analog converter is so designed that for each binary order a switch is provided for connecting the input of the amplifier following its associated amplifier to the output or to the input of its associated amplifier depending on the presence of a binary coefficient characterizing a binary "1" or a binary "0."

An advantageous embodiment of the digital-to-analog converter according to this invention is obtained by the provision that, instead of linear direct current amplifiers, linear current attenuators are connected in series, that the input of said series connection has applied thereto a constant direct current characterizing the greatest binary number, and that a switch associated with each binary order either bridges (binary "1") the associated current attenuator or does not bridge it (binary "0"). In this arrangement, the resolution may be adapted in a simple manner to the respective requirements by the selection of the attenuations and the magnitude of the constant current, respectively, fixed according to the invention. In particular, the digital-to-analog converter may be so designed that each of said current attenuators consists of an associated transistor in a grounded base configuration, the emitter of which has applied thereto the input current through a resistor, and that in parallel to the base-emitter path and to said resistor the series connection of a resistor and a switch is arranged, which switch when in its opened condition causes no attenuation and when in its closed condition causes the attenuation determined by the ratio of said two resistors of the output current flowing in the collector which constitutes a constant current source. In contrast to a chain circuit of voltage attenuators, such as voltage dividers including resistors, it is here possible with simple means to suppress the attenuation of one stage without affecting the attenuation of all preceding stages. That is done in the arrangement of this invention by the transistors in a grounded base configuration serving at the same time for current attenuation and for de-coupling purposes. When using the voltage dividers in the well-known manner, de-coupling of the attenuators among one another by means of amplifier elements, such as transistors, is hardly possible since—particularly for low voltage levels—the linearity is decreased unduly.

An especially simple structure of the digital-to-analog converter of this invention is obtained by the provision that the current source for the constant current characterizing the greatest binary number and the first current attenuator are realized by one single transistor operated in a grounded-base configuration, the emitter of which is connected through a resistor and the series connection of a resistor and a switch arranged in parallel thereto to a suitable connected voltage and in the collector of which flows, by a suitable selection of the resistance ratio, the constant current when said switch is closed (binary "1") and the fixed attenuated current when said switch is open (binary "0"). A further simplification is obtained by the provision that the last current attenuator consists merely of the parallel connection of a resistor through which the current characterizing the analog value flows and the series connection comprising a resistor and the switch which is open in the presence of a binary "1" and in which, by a suitable selection of the resistor ratio, with said switch closed (binary "0") the predetermined attenuation of the current is effected.

The invention will be described in detail below in conjunction with FIGURES 1 to 8 illustrating an embodiment of an analog-to-digital converter and a digital-to-analog converter.

Figure 2:
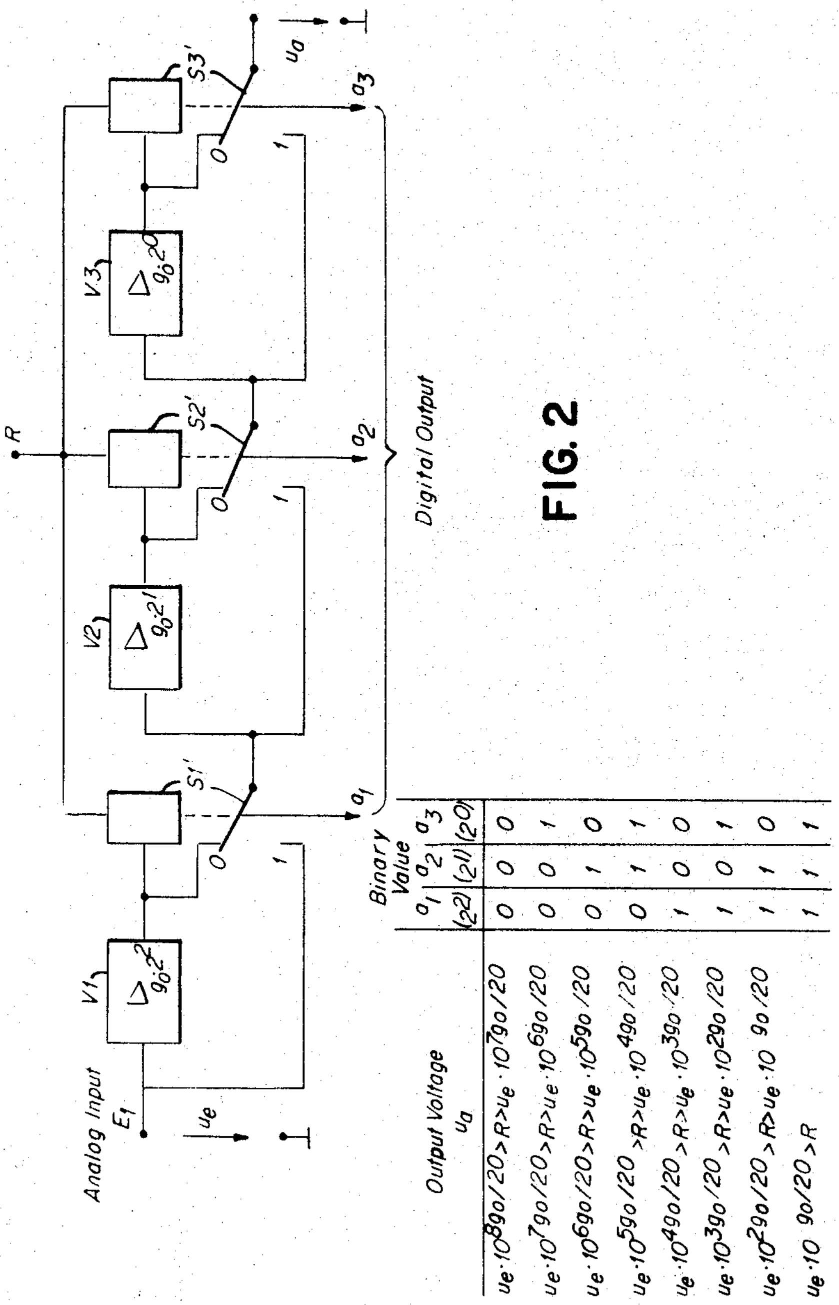
Figure 3:
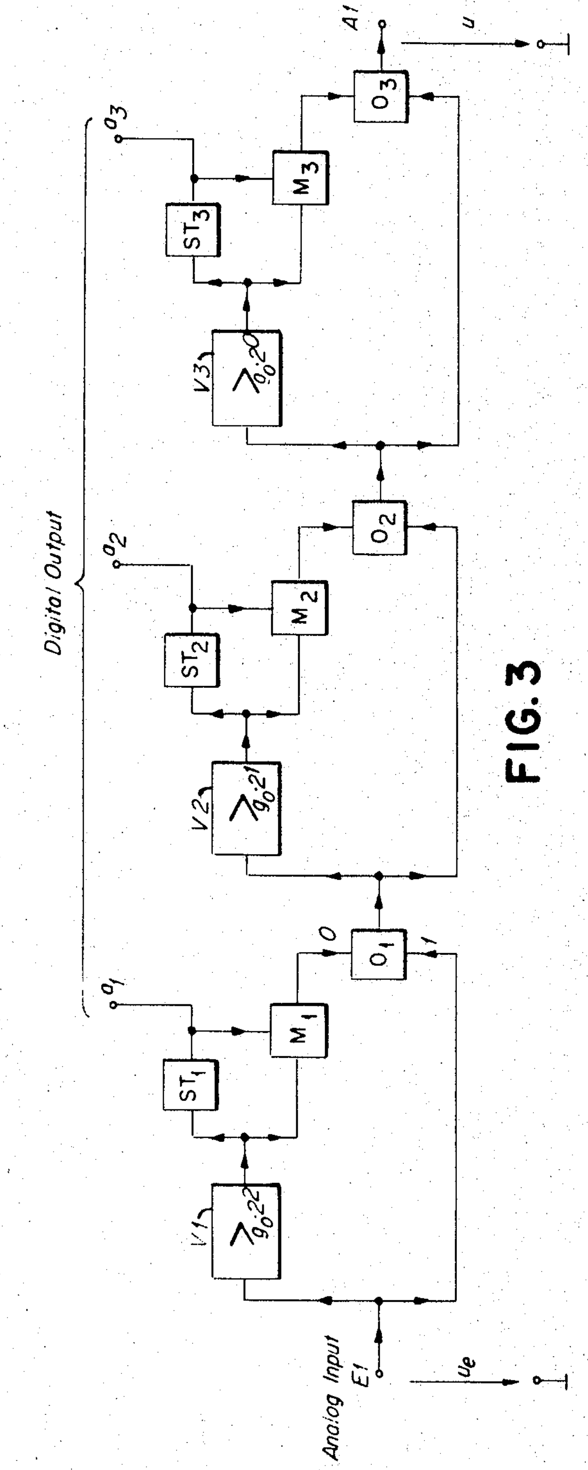
Figure 4:
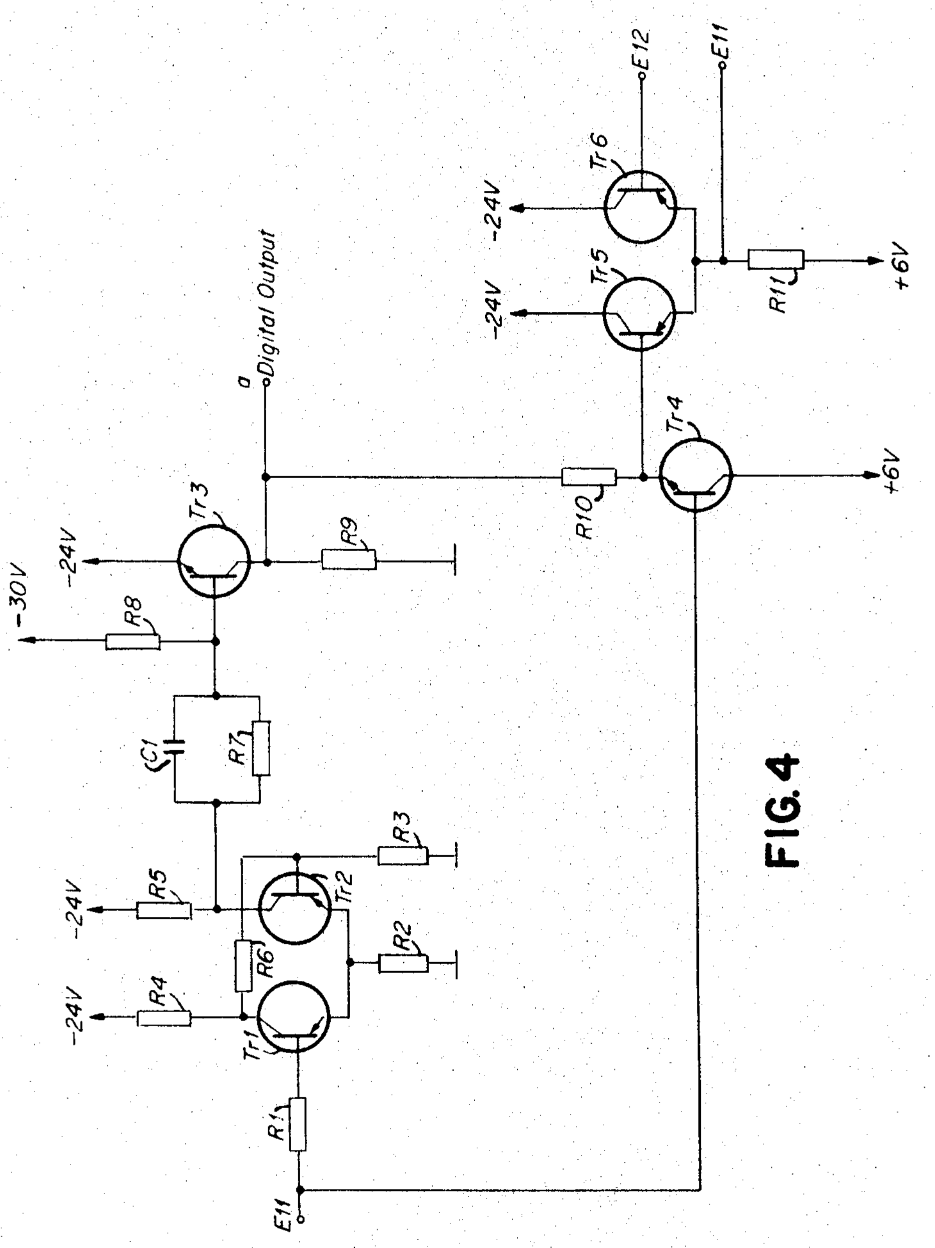
Figure 5:
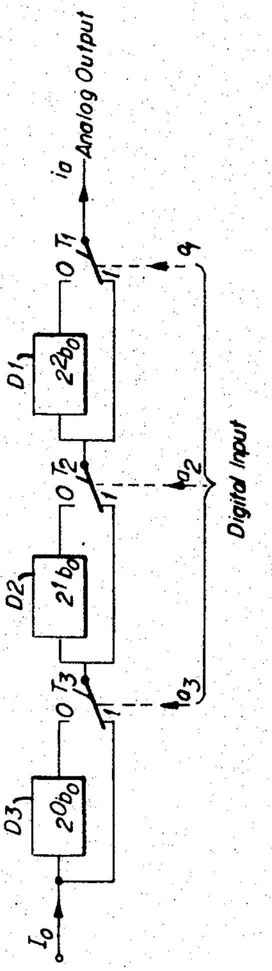
Figure 6:
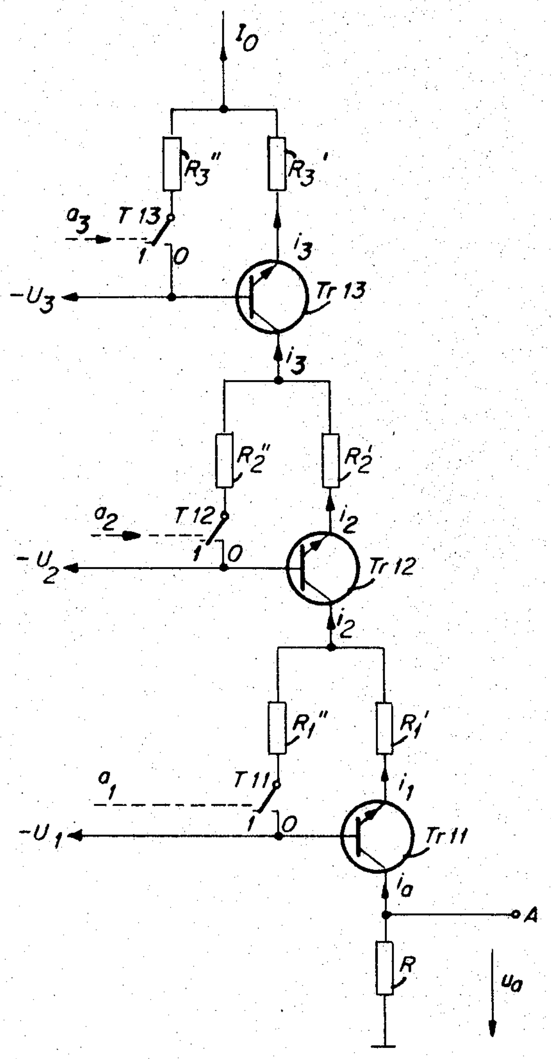
Figure 7:
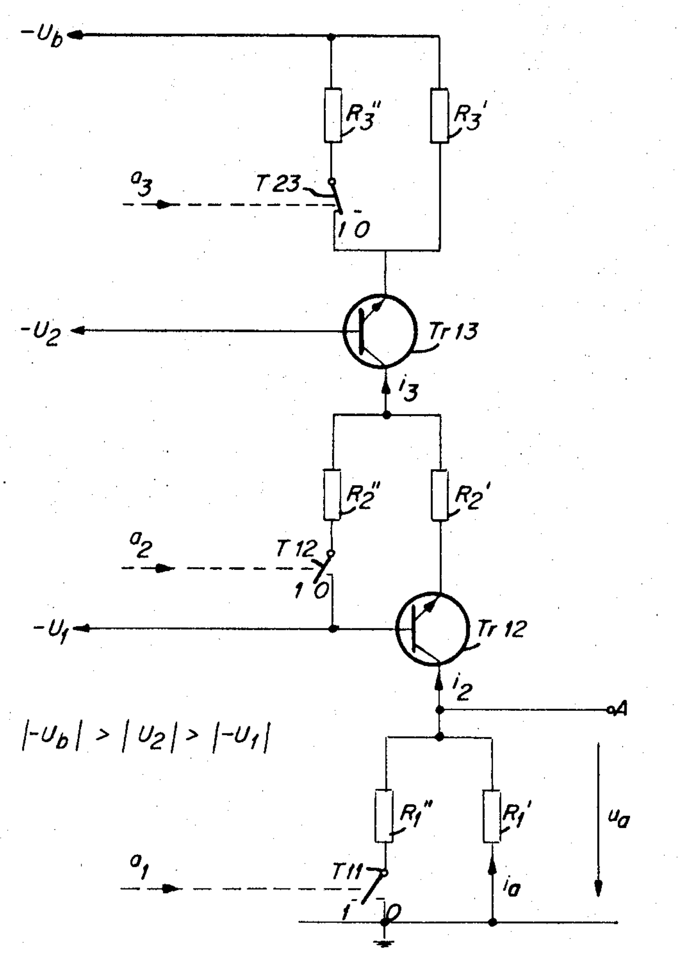
Figure 8:
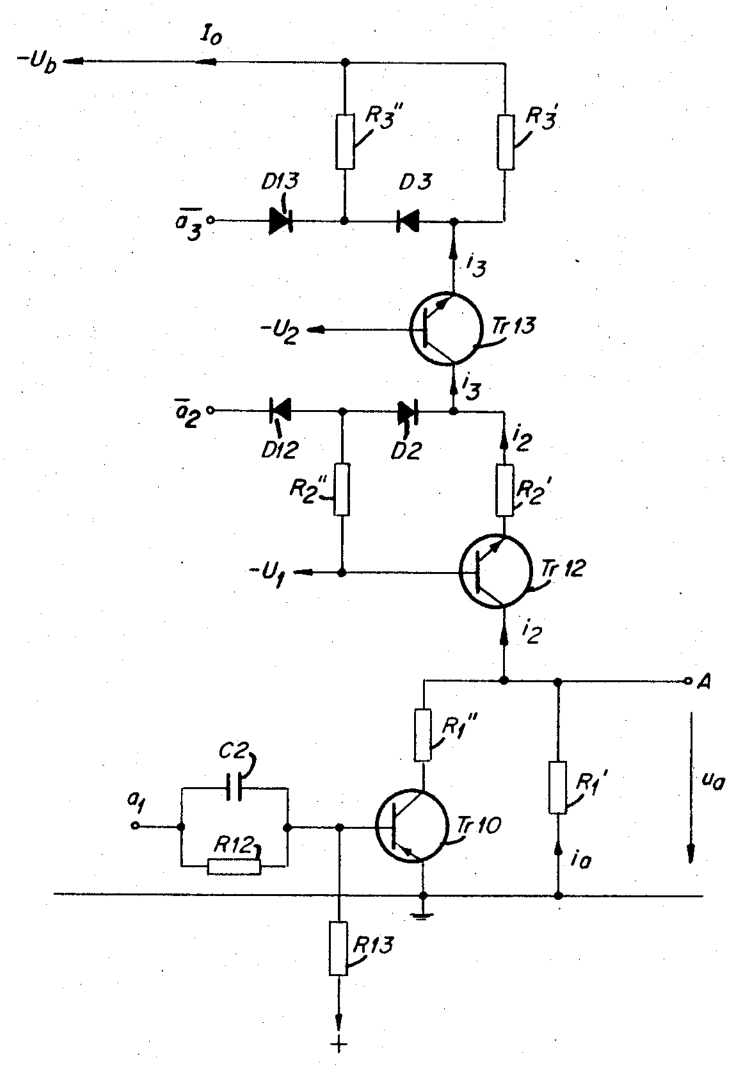

In the drawings:

FIG. 1 represents a block circuit diagram common to both of said converter types, FIG. 2 shows the basic embodiment of an analog-to-digital converter, FIG. 3 shows the converter of this invention as illustrated in FIG. 2 except that the switches employed therein have been replaced with the block circuit diagram of a purely electric switch, FIG. 4 shows the circuitry of that switch, FIG. 5 illustrates the basic embodiment of a digital-to-analog converter, FIG. 6 represents the circuitry of the converter shown in FIG. 5, FIG. 7 shows a simplified embodiment according to FIG. 6, FIG. 8 illustrates the embodiment shown in FIG. 7 in which the mechanical switches thereof have been replaced with electronic switches.

Each of the embodiments described below has been designed for three binary orders $a_1$ to $a_3$ but can, of course, be expanded to accommodate any desired number of binary orders. Accordingly, in FIG. 1 each of the amplifiers V1 to V3 has a respective switch S1 to S3 associated therewith. The gains of the amplifiers V1 to V3 are graded binarily from $2^2$ to $2^0$. Depending on the magnitude of the analog or digital value to be converted, the amplifiers are either connected in series or bridged by the switches. When effecting analog-to-digital conversion, the unbracketed binary values are assigned to the switch positions while for digital-to-analog conversion the bracketed binary values are assigned thereto.

FIGURES 2 and 3 show the basic realization of an analog-to-digital converter in accordance with this invention. The converter consists of $n$ linear D.C. voltage amplifiers, $n$ being the number of binary orders and $2^n$ indicating the number of stages. The gains are graded from $2^{n-1}\cdot g_0$, $2^{n-2}\cdot g_0$, . . . $2^2\cdot g_0$, $2^1\cdot g_0$ as measured in db. The amplifier at the analog input exhibits the largest gain, $2^{n-1}\cdot g_0$, db. The factor $g_0$ represents a gain factor which is constant for each amplifier and which is chosen in correspondence with the requirements, particularly with respect to the resolution. The output of each amplifier is connected to a threshold switch S1′ to S3′ which is equal for each stage and which in FIG. 2 consists of a mechanical switch in connection with a device for determining the threshold value R. If the amplifier output voltage is lower than the threshold R, the switch will occupy its position "0"; however, if the output voltage is higher than the threshold level R, the switch will be in its position "1." Switching is respectively effected when the threshold level R is exceeded or fallen below. With the switch in its position "0," the output of an amplifier is respectively connected to the input of the next following amplifier, while in the position "1" of the switch the input of the associated amplifier is connected to the input of the next following amplifier. The positions "0" or "1" of the switches are characteristic of the values of the individual binary coefficients $a_1$, $a_2$ and $a_3$. The weights of the individual binary orders result from the gradient of the gains of the individual amplifiers.

The operation of the analog-to-digital converter will be explained in detail in conjunction with the table. It is assumed that the voltage $u_e$ to be coded is applied to the analog input E1. All of the threshold switches S1′ to S3′ are in their OFF conditions, i.e. all of the amplifiers V1 to V3 are connected in series and contribute to the over-all gain of the converter in correspondence with their individual gains. As long as the input voltage $u_e$ to be encoded is only of such a level that the output voltage $u_a$ is lower than the threshold level R, all switches will remain in their "0" position. Accordingly, the binary value 000 is indicated at the digital output. In this case, the over-all gain of the converter is $$g_0\cdot(2^2+2^1+2^0)=7g_0$$

If now the input voltage $u_e$ rises until the output voltage $u_a$ has reached the level R, the threshold switch S3′ is actuated. The amplifier V3 now no longer contributes to the over-all gain which is only $g_0\cdot(2^2+2^1)=6g_0$. The binary value 001 will appear at the digital output.

This action is continued logically with the input voltage $u_e$ increasing, until all of the switches have been operated and accordingly the binary value 111 appears at the digital output. The over-all gain of the system is always an integral multiple of $g_0$ db. It can always be represented in the terms of $(a_1\cdot 2^2+a_2\cdot 2^1+a_3\cdot 2^0)\cdot g_0$. Each of the coefficients $a_1$, $a_2$ and $a_3$ can assume only the values 0 or 1. The value of each coefficient corresponds to the position of its associated switch. The converter represented in FIG. 3 is similar to the analog-to-digital converter shown in FIG. 2, except that a purely electronic threshold switch is used. A threshold switch consists of a Schmitt trigger ST, a modulator M and a gate circuit O for analog signals. The gate circuit O includes two inputs and one output. If voltages are applied to both inputs, that having the greater magnitude will appear at the output of the gate circuit. The modulator M is so designed that in its ON condition the ideal characteristic, output voltage equal to input voltage, is decisive. In the OFF condition, the output voltage is assumed to be, independently of the input voltage, equal to zero. The output e.g. of the amplifier V1 is connected to the control input of the Schmitt trigger ST1. The Schmitt trigger ST1 determines the selected threshold level R. Besides, the amplifier output is applied to the input of the modulator M.

The output potential of the Schmitt trigger ST1 is characteristic of the binary coefficient $a_1$. It corresponds in the triggered condition to a binary "1" (input voltage higher than threshold level R) and in the inoperative condition to a binary "0" (input voltage lower than threshold level R). The output of the Schmitt trigger moreover controls the modulator. In the presence of a binary "1" the voltage 0 will appear at the modulator output while in the presence of a binary "0" the input voltage to the modulator M which is equal to the amplifier output voltage will appear at the output of the modulator. The amplifier input and the modulator output are taken to the two inputs of the gate circuit O1 the output of which is connected to the input of the next stage. If the amplifier output voltage is lower than the threshold level R, the Schmitt trigger ST1 is in its inoperative condition. A binary "0" will appear at the output $a_1$. The modulator M1 is in its ON condition, so that the amplifier output voltage is present at one input of the gate circuit O1. Since this voltage is higher than the unamplified input voltage of the amplifier, it is applied via the output of the gate circuit O1 to the input of the next stage, i.e. the amplifier V1 contributes to the over-all gain. If the amplifier output voltage reaches the threshold level of the Schmitt trigger ST1, a binary "1" will appear at output $a_1$. The modulator M1 is moved to its OFF condition so that it will apply the voltage 0 to one input of gate circuit O1. Since the amplifier input voltage is greater than 0, it is applied through the gate circuit O1 to the input of the next stage. The amplifier V1 now no longer contributes to the over-all gain; it is bridged.

An operative embodiment of the circuit arrangement is shown in FIG. 4 to consist of the Schmitt trigger ST, the modulator M and the gate circuit O. The Schmitt trigger comprises the two transistors TR1 and TR2. The common emitter resistance R2, the two collector resistances R4 and R5 together with the resistor R6 included between the collector output of transistor TR1 and the base of transistor TR2, and the resistance R3 complete the circuit. The voltage divider comprising the resistances R4, R6 and R3 connects the base of transistor TR2 to a negative potential approximately equal to the desired threshold level R. The collector of transistor TR2 is connected through a coupling member comprising the resistor R7 and the condenser C1 to the base of a transistor TR3 which together with the two resistors R8 and R9 forms an amplifier stage. The collector output of transistor TR3 at the same time represents the digital output $a$ and is connected through the resistor R10 to the emitter of a transistor TR4 performing the function of the modulator M described above. The base of this latter transistor is connected to the input E11 of the Schmitt trigger. The emitter output of transistor TR4 is connected to the base of a transistor TR5 which together with a transistor TR6 and the common emitter resistor R11 forms the gate circuit O. The respective higher one of the voltages applied to the bases of the two transistors TR5 and TR6 is available at the output of the gate circuit at terminal A11. As long as the negative voltage (output voltage of an amplifier) applied to the terminal E11 is lower than the threshold level R, the transistor TR1 is cut off and the transistor TR2 conducts. Accordingly, also transistor TR3 is conductive, and a negative voltage is available at the digital output $a$, which corresponds to a binary "0." This negative voltage applied to the emitter of transistor TR4 causes the amplifier output voltage passed from terminal E11 to the base of this transistor to be applied to the base of transistor TR5. Since the amplifier output voltage is higher than that at terminal E12 and thus the amplifier input voltage applied to the base of transistor TR6, the amplifier output voltage is passed via the terminal A11 to the input of the amplifier of the following stage. If the negative voltage (output voltage of an amplifier) applied to terminal E11 is higher than the threshold level R, transistor TR1 conducts and transistor TR2 is cut off. Thus, also transistor TR3 is cut off, and a voltage of about 0 volt is present at the digital output, which corresponds to a binary "1." The 0 volt potential is now applied via resistor R10 to the emitter of the non-conductive transistor TR4 and to the base of transistor TR5. Since the amplifier input voltage applied to the terminal E12 and to the base of transistor TR6, respectively, is greater in magnitude than that voltage applied to the base of transistor TR5, it will be passed via terminal A11 to the input of the amplifier of the next following stage.

As is indicated in FIG. 1, a digital-to-analog converter may be constructed in a similar manner. Here, the threshold switches are not required as in connection with digital input the switches are operated externally. What follows is a detailed explanation of a digital-to-analog converter according to this invention, which represents an advantageous further improvement. Instead of a series connection of current or voltage amplifiers, a series connection of current attenuators is employed in this arrangement. As shown in FIG. 5, the over-all system then comprises a current attenuator the attenuation of which may be controlled in steps of $b_0$ db and in the input of which a constant current $I_0$ is flowing. The system consists of e.g. three current attenuators D1 to D3 having degrees of attenuation $2^2 \cdot b_0$, $2^1 \cdot b_0$ and $b_0$, respectively. Each of the three current attenuators may contribute, or not contribute, to the over-all attenuation depending on the coefficients $a_1$, $a_2$ and $a_3$. Between the constant input current $I_0$ and the output current $i_a$ there exists a relationship of $$20 \cdot \log \frac{i_a}{I_0} = (a_1 \cdot 2^2 + a_2 \cdot 2^1 + a_3 - 2^0) b_0 \text{ bd}$$

The entry of the binary values is effected by means of the switches T1 to T3. If a binary "0" is present, the associated attenuator contributes to the overall attenuation, while in the presence of a binary "1" it is bridged.

The table represented in FIG. 5 shows the relationship between the digital and the analog values. In the presence of the most significant binary number, the output current $i_a$ is equal to the constant input current $I_0$. If, however, all of the binary coefficients are 0, all attenuators will contribute to the attenuation, so that in the example under consideration the output current will be $i_a = I_0 \cdot 10^{-7b_0/20}$. The output current $i_a$ which accordingly characterizes the analog value may be converted through the voltage drop across a defined resistor into a proportional voltage.

Referring to FIG. 6, a corresponding operative circuit is illustrated therein. The constant input current $I_0$ is applied to the attenuator having the lowest degree of attenuation. An attenuator respectively consists of a transistor, such as TR13, the emitter circuit of which includes a resistor $R_3'$. Connected in parallel to that resistor and to the base-emitter path of the transistor is the series connection of an additional resistor $R_3''$ and the switch T13. The base is also connected to a suitably selected voltage $U_3$. The attenuation of each attenuator is determined by the ratio of the two resistors, $R'$ to $R''$. De-coupling of the individual attenuators is effected by the transistors TR11 to TR13, which are operated in a grounded-base configuration. With the switches T11 to T13 open, the attenuations are respectively equal to 0 db. On the other hand, with the switches closed, the attenuations have the desired, binarily graded values. The switch position is determined by the coefficients $a_1$, $a_2$ and $a_3$. An open switch corresponds to a binary "1" and a closed switch corresponds to a binary "0." The base current of the individual transistors may be assumed to be negligibly small as compared to the emitter current, so that practically the emitter and collector currents are equal. The collector of each transistor belonging to a current attenuator is practically the output of an ideal current source. The magnitude of the constant current is either equal to the input current of the current attenuator (open switch) or has a defined relationship to the magnitude of the input current (closed switch). The potentials $U_1$ to $U_3$ to which the base terminals of the transistors TR11 to TR13 are connected, should be maximally constant. For the magnitudes of these potentials it must always be true that $U_3>U_2>U_1$, $U_3-U_2>R'_2 \cdot I_0$ and $U_2-U_1>R'_1 \cdot I_0$. Derived at output A is the output voltage $u_a$ proportional to the antilogarithm of the corresponding binary number, which is produced by the output current $i_a$ at the collector resistor R.

The embodiment shown in FIG. 7 represents a further simplification of the embodiment illustrated in FIG. 6. For realizing a practically ideal current source with the constant current $I_0$, a transistor may be used. The current source for this constant current $I_0$ and the first current attenuator are realized by means of the transistor TR13. The output current $i_3$ of the first current attenuator should be, for $a_3=1$, equal to the input current $I_0$ while, for $a_3=0$, it should have a ratio to the current $I_0$ which is determined by the resistors $R'_3$ and $R''_3$. This requirement may be met by a suitable selection of the resistance of the parallel connection of $R'_3$ and $R''_3$. In this consideration, the voltage drop across the base-emitter path of the transistor TR13 has been neglected, which is the more permissible the larger the difference of the magnitudes of the voltages $U_b$ and $U_2$ is with respect to such voltage drop. It should also be noted at this stage that the closed switch T23 is assigned to the binary "1" and the open switch T23 is assigned to the binary "0". As a further simplification, the transistor TR11 has been eliminated in this embodiment. With a suitable dimensioning of the resistor $R_1$, the voltage drop occurring across it due to the current $i_a$ may be derived directly as an analog value and does not have to be de-coupled first by a transistor.

In FIG. 8, the switches T11 to T13 and T23, respectively, of the embodiments of FIGS. 6 and 7 are constructed by means of semiconductor components. The first two switches are realized by the well-known arrangement of two oppositely connected diodes D13, D3 and D12, D2. The third switch may also be constructed in this manner. In the embodiment, however, a transistor TR10 was used as the switch for the attenuator with the largest attenuation, because with small values of the output voltage $u_a$ the residual voltage at the semiconductor circuit path is of influence and that residual voltage is lower with the transistor saturated than with the diode conductive. Also, the demand for a low-ohmic circuit path is met better with the transistor than with the diode. The operation of the switches will be briefly explained as follows: The coefficients $a_1$, $a_2$ and $a_3$ are assumed to be characterized by the following voltage levels: The binary "0" corresponds to the voltage $-U_b$ and the binary "1" corresponds to the voltage 0 volt. To the inputs of those switches realized with diodes voltages should be applied which correspond to the negation of the coefficients. The coefficients $a_1=1$, $a_2=1$ and $a_3=1$ thus correspond at the digital inputs in the sequence used here to the voltages 0 volt, $-U_b$ volts and $-U_b$ volts. A binary "1" is assumed to be present at each of the binary inputs. In this case, an attenuation must not occur at any of the three attenuators. The voltage $-U_b$ at the diode D13 causes the latter to be blocked. The current $I_0$ flows through the parallel connection of $R'_3$ and the series connection of $R''_3$ and the conductive diode D3 and appears undivided as the collector current of TR13. The same voltage at the input for the coefficient $a_2$ causes the diode D12 to draw current through the resistor $R''_2$ and the voltage $-U_1$. Thereby the diode D2 is switched to its blocking condition, so that the current $i_3$ flowing out of the cathode of the transistor TR13, which in this case is equal to the constant input current $I_0$, is passed on to the next stage unattenuated. In correspondence with the binary "1" assumed here, a voltage of 0 volt is present at the input for the binary coefficient $a_1$. Through the coupling member C2, R12 and the resistor R13 connected to a positive voltage, a voltage is applied to the base of the transistor TR10 by which it is cut off. Thus a current does not pass through resistor $R''_1$ either, and no attenuation is effected. If it is now assumed that all binary coefficients are binary "0's", the 0 volt voltage is present at the first two binary inputs while the $-U_b$ volt voltage is present at the last binary input. In this case, all of the stages must contribute to the attenuation. The 0 volt voltage at the anode of diode D13 obviously causes part of the constant input current $I_0$ to be dissipated through resistor $R''_3$, whereby the required attenuation is effected. As a result of the 0 volt voltage at the cathode of diode D12 that diode is switched to its blocking condition. Since the cathode of diode D2 is connected to a higher negative voltage than $-U_1$, the required part of the current $i_3$ is dissipated through the resistor $R''_2$. The voltage $-U_b$ at the binary input for the coeffiicent $a_1$ causes the transistor R10 to conduit, so that again the required part of the current $i_2$ is dissipated through resistor $R''_1$.

I claim:

1. An analog-to-digital converter for converting logarithmic electric analog values into binary numbers represented in parallel comprising:
   a plurality of series connected converter stages, each stage comprising:
   an input terminal,
   an amplifier electrically connected to said input terminal,
   a sensing circuit electrically connected to the output of said amplifier comparing the output of said amplifier with a given threshold value, said sensing circuit operative to connect the output of said amplifier to the output terminal of the converter stage when the output of the amplifier is equal or greater than the threshold value, said sensing circuit additionally operatively connecting the input of said converter stage to the output of said converter stage when said sensing circuit detects an output of said amplifier less than the threshold value,
   the gain of the amplifier in each of said successive converter stages being equal to one-half the gain of the amplifier in the preceding converter stage where the gain of the highest gain stage is $2^{n-1} \cdot G_0$ and the gain of the lowest gain stage is $2^0 \cdot G_0$ where $n$ is the number of said converter stages in series connection.

2. The analog-to-digital converter of claim 1 wherein the sensing network is a Schmitt trigger.

References Cited

UNITED STATES PATENTS

| | | | |
|---|---|---|---|
| 2,950,469 | 8/1960 | Raasch | 340—347 |
| 3,119,105 | 1/1964 | Jepperson | 340—347 |
| 3,264,637 | 8/1966 | Parkinson | 340—347 |
| 2,592,308 | 4/1952 | Meacham | 340—347 |
| 3,041,469 | 6/1962 | Ross | 340—347 XR |
| 3,146,438 | 8/1964 | Peterson et al. | 340—347 |
| 3,188,624 | 6/1965 | McMillan | 340—347 |
| 3,246,314 | 4/1966 | Kaenel | 340—347 |

OTHER REFERENCES

Mackay, IBM Technical Disclosure Bulletin, vol. 7, No. 3, August 1964, pp. 267 and 268.

MAYNARD R. WILBUR, *Primary Examiner.*

U.S. Cl. X.R.

330—150